(12) United States Patent
Yoo et al.

(10) Patent No.: US 9,548,401 B2
(45) Date of Patent: Jan. 17, 2017

(54) SEMICONDUCTOR DEVICE

(71) Applicant: SAMSUNG ELECTRONICS CO., LTD., Suwon-si, Gyeonggi-do (KR)

(72) Inventors: Jae-Hyun Yoo, Suwon-si (KR); Jin-Hyun Noh, Seoul (KR); Su-Tae Kim, Suwon-si (KR); Byeong-Ryeol Lee, Yongin-si (KR); Seong-Hun Jang, Suwon-si (KR); Jong-Sung Jeon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/698,909

(22) Filed: Apr. 29, 2015

(65) Prior Publication Data
US 2016/0149057 A1    May 26, 2016

(30) Foreign Application Priority Data

Nov. 20, 2014    (KR) .......................... 10-2014-0162610

(51) Int. Cl.
*H01L 29/02* (2006.01)
*H01L 29/94* (2006.01)
*H01L 29/78* (2006.01)
*H01L 27/06* (2006.01)
*H01L 29/10* (2006.01)

(52) U.S. Cl.
CPC ........... *H01L 29/94* (2013.01); *H01L 27/0629* (2013.01); *H01L 29/7851* (2013.01); *H01L 29/1041* (2013.01); *H01L 29/7833* (2013.01); *H01L 29/7838* (2013.01)

(58) Field of Classification Search
CPC  H01L 27/105; H01L 27/115; H01L 27/11526; H01L 27/0688; H01L 29/1045; H01L 29/66181; H01L 29/66189
USPC ......................................... 257/296–300, 312
See application file for complete search history.

(56) References Cited

U.S. PATENT DOCUMENTS

| 5,374,839 | A | * | 12/1994 | Jeon | ....................... | H01L 27/105 |
| | | | | | | 257/296 |
| 5,548,148 | A | | 8/1996 | Bindal | | |
| 5,914,513 | A | * | 6/1999 | Shenai | ................ | H01L 27/0688 |
| | | | | | | 257/312 |
| 5,917,219 | A | * | 6/1999 | Nandakumar | ...... | H01L 29/1045 |
| | | | | | | 257/327 |

(Continued)

FOREIGN PATENT DOCUMENTS

| JP | 2005-210005 | 8/2005 |
| JP | 2008-218852 | 9/2008 |

(Continued)

*Primary Examiner* — Michael Lebentritt
(74) *Attorney, Agent, or Firm* — Volentine & Whitt, PLLC

(57) ABSTRACT

A semiconductor device includes a substrate including a first impurity diffusion region having a first doping concentration and at least one second impurity diffusion region having a second doping concentration different from the first doping concentration, the at least one second impurity region being surrounded by the first impurity diffusion region; at least one electrode facing the first impurity diffusion region and the at least one second impurity diffusion region; and at least one insulating layer between the first impurity diffusion region and the at least one electrode, and between the at least one second impurity diffusion region and the at least one electrode.

15 Claims, 19 Drawing Sheets

(56) References Cited

U.S. PATENT DOCUMENTS

| | | | |
|---|---|---|---|
| 6,081,007 A * | 6/2000 | Matsuoka | H01L 29/1045 257/219 |
| 6,091,116 A * | 7/2000 | Kim | H01L 21/823892 257/371 |
| 6,103,562 A | 8/2000 | Son et al. | |
| 6,406,955 B1 * | 6/2002 | Kim | H01L 27/0922 257/E21.644 |
| 6,479,846 B2 * | 11/2002 | Tichauer | H01L 29/7835 257/219 |
| 6,716,701 B1 * | 4/2004 | Kwak | H01L 27/11526 257/E21.422 |
| 7,345,354 B2 * | 3/2008 | Johnson | H01L 29/94 257/595 |
| 7,622,760 B2 * | 11/2009 | Ogawa | H01L 29/0684 257/300 |
| RE41,764 E * | 9/2010 | Skotnicki | H01L 21/2253 257/335 |
| 8,450,827 B2 | 5/2013 | Huang et al. | |
| 8,803,288 B1 * | 8/2014 | Marino | H01G 7/00 257/602 |
| 2008/0002476 A1 * | 1/2008 | Yoo | H01L 27/115 365/185.18 |
| 2008/0185625 A1 * | 8/2008 | Yim | H01L 27/0805 257/300 |
| 2008/0246071 A1 * | 10/2008 | Sarkar | H01L 29/66189 257/312 |
| 2009/0079032 A1 | 3/2009 | Marreiro et al. | |
| 2010/0059859 A1 | 3/2010 | Trivedi | |
| 2012/0139020 A1 * | 6/2012 | Chen | H01L 29/66181 257/296 |
| 2013/0062691 A1 * | 3/2013 | Koo | H01L 29/7835 257/335 |

FOREIGN PATENT DOCUMENTS

| | | |
|---|---|---|
| JP | 2009-111112 | 5/2009 |
| KR | 10-2004-0059846 A | 7/2004 |
| KR | 10-2005-0020296 A | 3/2005 |
| KR | 10-2007-0010854 A | 1/2007 |
| KR | 10-2007-0010882 A | 1/2007 |

* cited by examiner

SEMICONDUCTOR DEVICE

CROSS-REFERENCE TO RELATED APPLICATION

A claim of priority under 35 U.S.C. §119 is made to Korean Patent Application No. 10-2014-0162610, filed on Nov. 20, 2014, in the Korean Intellectual Property Office, the contents of which are herein incorporated by reference in their entirety.

BACKGROUND

The inventive concept generally relates to semiconductor devices, and more particularly, to semiconductor devices which may include metal oxide semiconductor (MOS) capacitors.

As multi-functional and compact devices are frequently used in electronic apparatuses, highly integrated system-large scale integrated circuits (LSIs) have been developed. In a process of manufacturing a logic integrated circuit (IC)-based system LSI, devices, such as a memory device, a high voltage transistor or a logic IC, are formed on the same substrate, and thus, a highly integrated system LSI additionally includes a storage function and a power management function. Along with the miniaturization of system LSIs, sizes of logic ICs included therein have also been reduced according to a size scaling rule for IC devices.

In addition, devices having a relatively high well doping concentration are needed according to the scaling of IC devices, and also, when forming such devices, a MOS capacitor that is used as a varactor may also be formed to implement a system on chip (SOC). However, when a MOS capacitor is formed on a substrate having a relatively high well doping concentration, a minimum capacitance (Cmin) may increase in a depletion operational state when a depletion layer is formed at an interface between an insulating layer and a semiconductor in the MOS capacitor. As a result, a range between a maximum capacitance (Cmax) and the minimum capacitance (Cmin), which determines a tuning range of the MOS capacitor, becomes narrow, and thus, the tunability of a the MOS capacitor may deteriorate.

SUMMARY

The inventive concept provides a semiconductor device which may constitute a metal oxide semiconductor (MOS) capacitor having a structure with a reduced minimum capacitance so that a range between a maximum capacitance (Cmax) and a minimum capacitance (Cmin) is increased, the range determining a tuning range of the MOS capacitor implemented in a substrate having a relatively high doping concentration.

According to an aspect of the inventive concept, there is provided a semiconductor device including a substrate including a first impurity diffusion region having a first doping concentration and at least one second impurity diffusion region having a second doping concentration different from the first doping concentration, the at least one second impurity region being surrounded by the first impurity diffusion region, at least one electrode facing the first impurity diffusion region and the at least one second impurity diffusion region, and at least one insulating layer between the first impurity diffusion region and the at least one electrode, and between and at least one second impurity diffusion region and the at least one electrode.

In some embodiments, the at least one electrode may include an electrode facing the first impurity diffusion region and the second impurity diffusion region.

In some embodiments, the at least one electrode may include a first electrode facing the first impurity diffusion region, and a second electrode facing the at least one second impurity diffusion region and being spaced apart from the first electrode.

In some embodiments, the substrate may include an active region having a flat upper surface, wherein the first impurity diffusion region and the at least one second impurity diffusion region are formed in the active region having the flat upper surface, and the at least one electrode is a planar type electrode formed on the flat upper surface of the active region.

In some embodiments, the substrate may include a fin-type active region protruding upward, wherein the first impurity diffusion region and the at least one second impurity diffusion region are formed in the fin-type active region, the at least one electrode has a pair of vertical surfaces facing both sides of the fin-type active region and a horizontal surface facing an upper surface of the fin-type active region, and an insulating layer is between the fin-type active region and the vertical surfaces of the electrode and between the fin-type active region and the horizontal surface of the electrode.

In some embodiments, the substrate may include a plurality of fin-type active regions that protrude upward and extend in parallel to each other, wherein the first impurity diffusion region and the at least one second impurity diffusion region are formed in each of the plurality of fin-type active regions, and the at least one electrode extends in a direction that intersects the plurality of fin-type active regions.

In some embodiments, the substrate may include a plurality of fin-type active regions that protrude upward and extend in parallel to each other, wherein the first impurity diffusion region and the at least one second impurity diffusion region are formed in each of the plurality of fin-type active regions, and the at least one electrode includes one electrode formed on the plurality of fin-type active regions to face the plurality of fin-type active regions.

In some embodiments, the first impurity diffusion region and the at least one second impurity diffusion region may be of a same conductive type.

According to another aspect of the inventive concept, there is provided a semiconductor device including a substrate having an active region, a lower electrode including first and second impurity diffusion regions formed in the active region, the first and second impurity diffusion regions having different doping concentrations, an upper electrode facing the lower electrode, and an insulating layer between the lower electrode and the upper electrode.

In some embodiments, the first impurity diffusion region may surround a bottom surface and a sidewall of the second impurity diffusion region.

In some embodiments, a first depth from an upper surface of the substrate to a bottom surface of the first impurity diffusion region may be greater than a second depth from the upper surface of the substrate to a bottom surface of the second impurity diffusion region.

In some embodiments, the second impurity diffusion region may include a plurality of pattern regions spaced apart from each other in the first impurity diffusion region.

In some embodiments, the plurality of pattern regions may extend in parallel to each other in a thickness direction of the substrate.

In some embodiments, the upper electrode may have a surface facing the first and second impurity diffusion regions, the insulating layer being interposed between the upper electrode and the first and second impurity diffusion regions.

In some embodiments, the first impurity diffusion region and the second impurity diffusion region may be of a same conductive type.

According to another aspect of the inventive concept, there is provided a semiconductor device including a metal oxide semiconductor (MOS) transistor, wherein the MOS transistor includes a lower electrode including a semiconductor material doped with impurities; an upper electrode facing the lower electrode, and an insulating layer between the lower electrode and the upper electrode, wherein a doping concentration of the lower electrode is not uniform in a direction in which the insulating layer extends.

In some embodiments, the lower electrode may include a first impurity diffusion region and a second impurity diffusion region which are of a same conductive type and have different doping concentrations, wherein the second impurity diffusion region is surrounded by the first impurity diffusion region.

In some embodiments, an impurity concentration of the second impurity diffusion region may be less than that of the first impurity diffusion region.

In some embodiments, the second impurity diffusion region may include a plurality of pattern regions spaced apart from each other, wherein the plurality of pattern regions extend in parallel to each other in a thickness direction of the substrate.

In some embodiments, the at least one electrode may include a doped semiconductor, a metal, a conductive metal nitride, a metal silicide, or a combination thereof.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
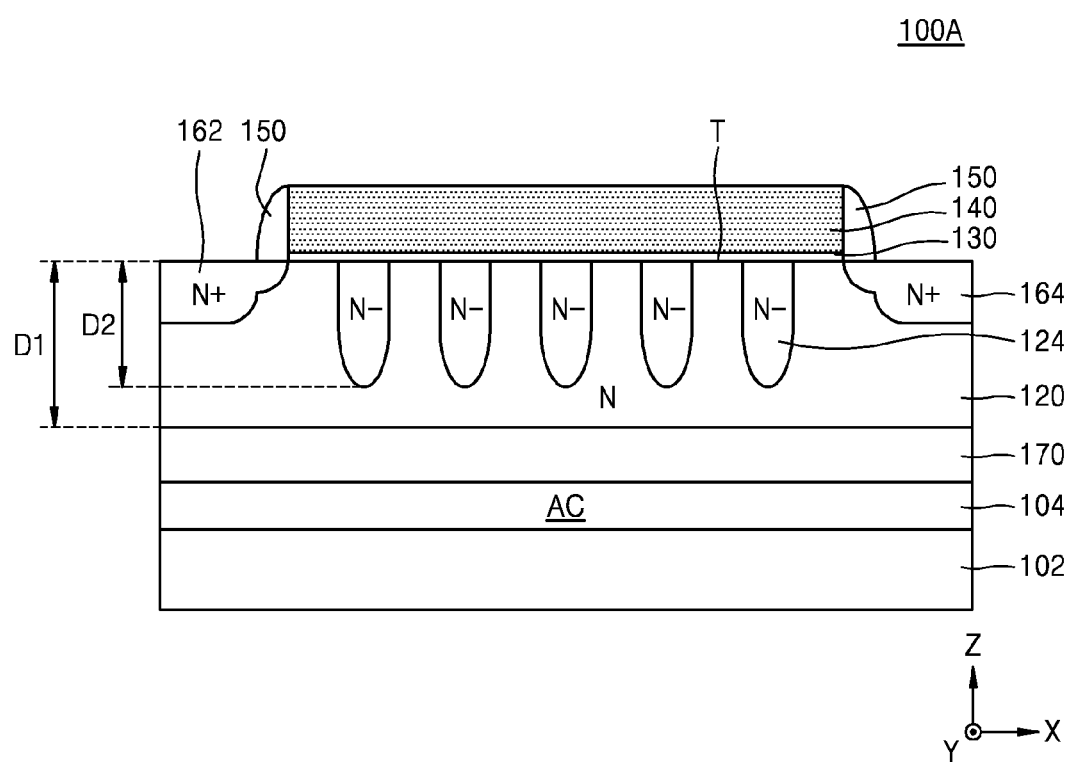
FIG. 1 is a cross-sectional view of a semiconductor device according to an exemplary embodiment of the inventive concept.

Hereinafter, exemplary embodiments of the inventive concept will be described in detail with reference to the accompanying drawings. Like reference numerals in the drawings denote like elements, and thus their redundant description will be omitted.

The inventive concept will now be described more fully with reference to the accompanying drawings, in which exemplary embodiments of the inventive concept are shown. The inventive concept may, however, be embodied in many different forms and should not be construed as being limited to the exemplary embodiments set forth herein; rather, these exemplary embodiments are provided so that this disclosure will be thorough and complete, and will fully convey the inventive concept to those of ordinary skill in the art.

It will be understood that although the terms "first", "second", etc. are used herein to describe members, regions, layers, portions, sections, components, and/or elements in exemplary embodiments of the inventive concept, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concept. For example, a first element may also be referred to as a second element, and similarly, a second element may also be referred to as a first element, without departing from the scope of the inventive concept.

Unless otherwise defined, all terms (including technical and scientific terms) used herein have the same meaning as commonly understood by those of ordinary skill in the art to which the inventive concept pertains. It will also be understood that terms, such as those defined in commonly used dictionaries, should be interpreted as having a meaning that is consistent with their meaning in the context of the relevant art and will not be interpreted in an idealized or overly formal sense unless expressly so defined herein.

When a certain exemplary embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the exemplary embodiments of the inventive concept should not be construed as being limited to the particular shapes of regions illustrated herein but may be construed to include deviations in shapes that result, for example, from a manufacturing process. Expressions such as "at least one of," when preceding a list of elements, modify the entire list of elements and do not modify the individual elements of the list.

In the present specification, the term MOS (metal-oxide-semiconductor) is a term widely used in this field. "M" is not limited to only metal but may be formed as conductors of various types and various shapes. "S" may be formed as a substrate or a semiconductor structure. "O" is not limited to an oxide but may include various types of inorganic materials or organic materials. The term "semiconductor" may include a monocrystalline semiconductor, a polycrystalline semiconductor, an amorphous semiconductor, a 4 group semiconductor, or a compound semiconductor. Conductive types of elements or doping regions may be defined as "P type" or "N type" according to a characteristic of a main carrier but this is merely for convenience of description and the inventive concept is not limited as described above. For example, "P type" or "N type" may be used as a more general term "first conductive type" or "second conductive type". In this regard, the first conductive type may be P type or N type, and the second conductive type may be N type or P type.

FIG. 1 is a cross-sectional view of a semiconductor device 100A according to an exemplary embodiment of the inventive concept.

Referring to FIG. 1, the semiconductor device 100A includes a substrate 102 having an active region AC, and a first conductive type well 104 formed in the active region AC. In the active region AC, a first impurity diffusion region 120 of a second conductive type is formed on the first conductive type well 104. In some embodiments, the first conductive type may be a P type, and the second conductive type may be an N type. The first impurity diffusion region 120 may include second conductive type impurities having a first doping concentration.

The substrate 102 may include a semiconductor, such as Si or Ge, or a compound semiconductor, such as SiGe, SiC, GaAs, InAs, or InP. Also, the substrate 102 may have a silicon on insulator (SOI) structure.

In some embodiments, the first conductive type well 104 may be a P type well including impurities formed of boron (B) atoms. The first impurity diffusion region 120 may be an N type impurity diffusion region including impurities formed of phosphorous (P) atoms.

At least one second impurity diffusion region 124, which is surrounded by the first impurity diffusion region 120 and has a second doping concentration that is different from the first doping concentration, is formed in the first impurity diffusion region 120. The first impurity diffusion region 120 and that at least one second impurity diffusion region 124 may have the same conductive type. In some embodiments, the at least one second impurity diffusion region 124 may have an impurity doping concentration that is less than that of the first impurity diffusion region 120. For example, the first impurity diffusion region 120 may have an impurity concentration that is selected in the range of about $1 \times 10^{16}$ atoms/cm$^3$ to about $1 \times 10^{21}$ atoms/cm$^3$, and the at least one second impurity diffusion region 124 may have an impurity concentration that is selected in the range of about $1 \times 10^{15}$ atoms/cm$^3$ to about $1 \times 10^{17}$ atoms/cm$^3$ and is less than that of the first impurity diffusion region 120. However, these numerical values are only examples, and the inventive concept is not limited thereto.

In the cross-sectional view of the semiconductor device 100A, illustrated in FIG. 1, the at least one second impurity diffusion region 124 includes a plurality of second impurity diffusion regions 124 spaced apart from each other. However, in a plan view of the semiconductor device 100A, the plurality of second impurity diffusion regions 124 may be spaced apart from each other or at least some of the plurality of second impurity diffusion regions 124 may be connected to each other.

In some embodiments, the plurality of second impurity diffusion regions 124 may have the second doping concentration that is less than the first doping concentration, and may have the same impurity concentration as each other. In some other embodiments, the plurality of second impurity diffusion regions 124 may have a doping concentration that is less than the first doping concentration, and at least some of the plurality of second impurity diffusion regions 124 may have different impurity concentrations.

The active region AC may have a flat upper surface T. The first impurity diffusion region 120 and the plurality of second impurity diffusion regions 124 are formed on the flat surface T of the active region AC, and thus, the first impurity diffusion region 120 and the plurality of second impurity diffusion regions 124 each may also have a flat surface.

The first impurity diffusion region 120 may have a shape surrounding the bottom surface and the sidewall of each of the plurality of second impurity diffusion regions 124. A first depth D1 from the upper surface of the substrate 102 to the bottom surface of the first impurity diffusion region 120 is larger than a second depth D2 from the upper surface of the substrate 102 to the bottom surfaces of the plurality of the second impurity diffusion regions 124.

The plurality of second impurity diffusion regions 124 may extend parallel to each other in the first impurity diffusion region 120 and in a thickness direction (Z direction in FIG. 1) of the substrate 102.

An electrode 140, which faces the first impurity diffusion region 120 and the plurality of second impurity diffusion regions 124, is formed above the active region AC. An insulating layer 130 is interposed between the first and second impurity diffusion regions 120 and 124 and the electrode 140.

In the exemplary embodiment of FIG. 1, one electrode 140 is formed on the first impurity diffusion region 120 and the plurality of second impurity diffusion regions 124. However, the inventive concept is not limited thereto, and for example, a plurality of electrodes may be disposed on the first impurity diffusion region 120 and the plurality of second impurity diffusion regions 124. This structure will be described in more detail with reference to FIGS. 5 and 6 later.

Both sidewalls of the insulating layer 130 and both sidewalls of the electrode 140 may be covered by an insulating spacer 150.

The insulating layer 130 may include a silicon oxide film, a high dielectric film, or a combination thereof. The high dielectric film may be formed of a material having a dielectric constant that is greater than that of a silicon oxide film. For example, the insulating layer 130 may have a dielectric constant of about 10 to about 25. The high dielectric film may be formed of a material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. However, the material of the high dielectric film is not limited thereto. The insulating layer 130 may be formed by using an atomic layer deposition (ALD) process, a chemical vapor deposition (CVD) process, or a physical vapor deposition (PVD) process.

The electrode 140 may be formed of conductive polysilicon, metal, conductive metal nitride, metal silicide, or a combination thereof. Each of the metal and the conductive metal nitride may include at least one selected from the group consisting of Ti, Ta, W, Ru, Nb, MO, and Hf but is not limited thereto. The metal nitride may be formed of TiN, TaN, or a combination thereof, but is not limited thereto. The metal silicide may be formed of titanium silicide, tungsten silicide, molybdenum silicide, nickel silicide, or cobalt silicide, but is not limited thereto. The electrode 140 may be formed by using a CVD process, a PVD process, an ALD process, a metal organic ALD (MOALD) process, or a metal organic CVD (MOCVD) process.

The insulating spacer 150 may be formed of an oxide film, a nitride film, or a combination thereof.

A source region 162 and a drain region 164 are formed in the active region AC of the substrate 102 at both sides of the electrode 140. In some embodiments, the source region 162 and the drain region 164 may each include second conductive type impurities having a third doping concentration that is greater than the first doping concentration. For example, the source region 162 and the drain region 164 may each have an impurity concentration in the range of about $1 \times 10^{18}$ atoms/cm$^3$ to about $1 \times 10^{22}$ atoms/cm$^3$ and that is greater than that of the first impurity diffusion region 120, but are not limited thereto.

In the substrate 102, a deep well 170 for device isolation is formed under the first impurity diffusion region 120. In some embodiments, the deep well 170 may be an N type impurity diffusion region, bust is not limited thereto.

The semiconductor device 100A illustrated in FIG. 1 may have a triple-well structure in which a P type well 104, an N type deep well 170, and an N type first impurity diffusion region 120 are sequentially formed in the substrate 102.

When the source region 162 and the drain region 164 are N+ type doping regions, an NMOS capacitor may be obtained. As another example, when the source region 162 and the drain region 164 are P+ type doping regions, a PMOS capacitor may be obtained.

In the semiconductor device 100A illustrated in FIG. 1, the first impurity diffusion region 120 and the plurality of second impurity diffusion regions 124, formed in the substrate 102, may form a lower electrode of a MOS capacitor. The electrode 140 may form an upper electrode of the MOS capacitor. Since the first impurity diffusion region 120 and each of the plurality of second impurity diffusion regions 124 have different impurity concentrations, a first capacitance may be obtained due to the first impurity diffusion region 120, the electrode 140, and the insulating layer 130 interposed therebetween, and a second capacitance different from the first capacitance may be obtained due to the plurality of second impurity diffusion regions 124, the electrode 124, and the insulating layer 130 interposed therebetween. In this manner, as the plurality of second impurity diffusion regions 124 each having a doping concentration that is less than that of the first impurity diffusion region 120 are included in the first impurity diffusion region 120, a MOS capacitor in which a plurality of capacitors providing different capacitance values are connected to each other in parallel may be implemented in the semiconductor device 100A.

In some embodiments, as the impurity doping concentration of the plurality of second impurity diffusion regions 124 is less than that of the first impurity diffusion region 120, the overall impurity doping concentration in a region including the first impurity diffusion region 120 and the plurality of second impurity diffusion regions 124 may be less than the impurity doping concentration of the first impurity diffusion region 120. Accordingly, even though a well doping concentration in the substrate 102 increases due to a demand for devices having a relatively high well doping concentration according to the scaling of integrated circuit devices, a phenomenon, in which a range between a maximum capacitance (Cmax) and a minimum capacitance (Cmin), which determines a tuning range in a MOS variable capacitor, becomes narrow due to a high well doping concentration in the substrate 102 and thus tunability of the MOS variable capacitor is deteriorated, may be prevented.

Figure 2A:
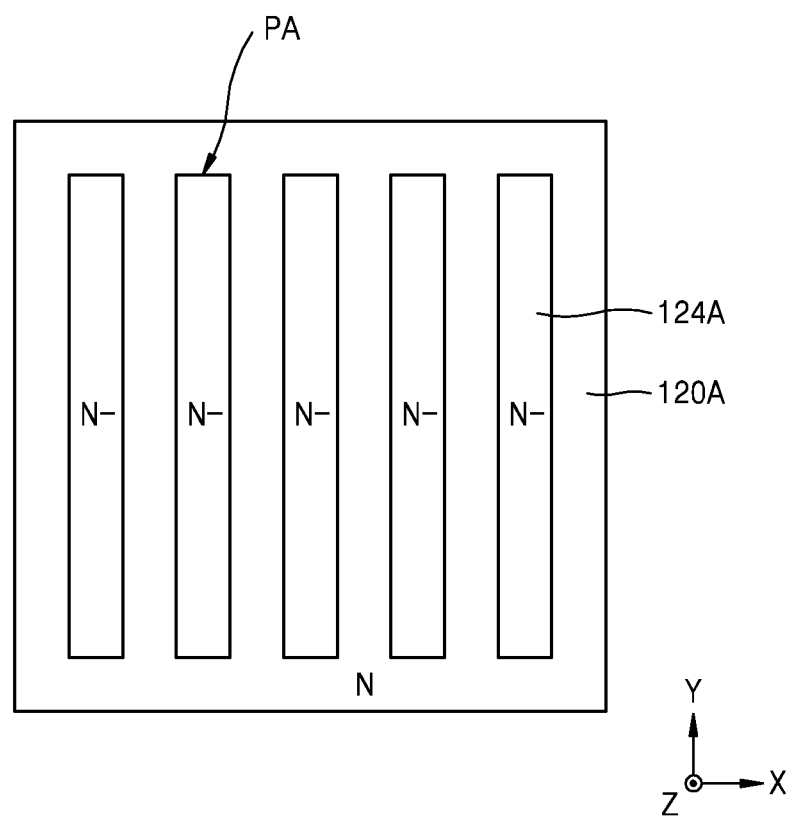
FIGS. 2A and 2B are plan views showing exemplary planar structures of a first impurity diffusion region and a plurality of second impurity diffusion regions of the semiconductor device illustrated in FIG. 1.
Figure 2B:
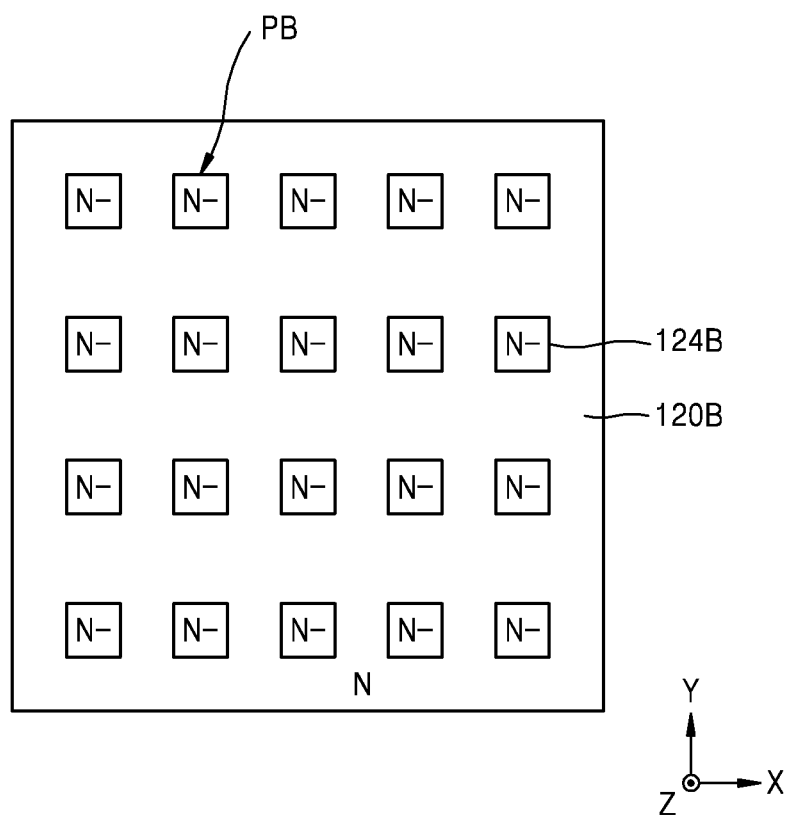

FIGS. 2A and 2B are plan views showing exemplary planar structures of the first impurity diffusion region 120 and the plurality of second impurity diffusion regions 124 of the semiconductor device 100A illustrated in FIG. 1.

In some embodiments, the first impurity diffusion region 120 of FIG. 1 may have a planar structure of a first impurity diffusion region 120A illustrated in FIG. 2A, and the plurality of second diffusion regions 124 of FIG. 1 may have a planar structure of a plurality of second impurity diffusion regions 124A illustrated in FIG. 2A.

The plurality of second impurity diffusion regions 124A may be formed of a plurality of pattern regions PA spaced apart from each other. The plurality of pattern regions PA may each have a rectangular plane shape having a long side in the Y direction and may extend parallel to each other in the first diffusion region 120A. The plurality of pattern regions PA may extend parallel to each other in a thickness direction (Z direction) of the substrate 120, like the plurality of second impurity diffusion region 124 illustrated in FIG. 1.

In FIG. 2A, although the plurality of second impurity diffusion region 124A are spaced apart from each other, at least some of the plurality of second impurity diffusion region 124A may be connected to each other.

In some other embodiments, the first impurity diffusion region 120 of FIG. 1 may have a planar structure of a first impurity diffusion region 120B illustrated in FIG. 2B, and the plurality of second diffusion regions 124 of FIG. 1 may have a planar structure of a plurality of second impurity diffusion regions 124B illustrated in FIG. 2B.

The plurality of second impurity diffusion regions 124B may be formed of a plurality of pattern regions PB spaced apart from each other. The plurality of pattern regions PB may have shapes of a plurality of dots arranged in a matrix form in the X direction and the Y direction. The plurality of pattern regions PB may extend parallel to each other in a thickness direction (Z direction) of the substrate 120, like the plurality of second impurity diffusion region 124 illustrated in FIG. 1.

In FIG. 2B, although the plurality of second impurity diffusion region 124B are spaced apart from each other, at least some of the plurality of second impurity diffusion region 124B may be connected to each other.

Although planar structures of the first impurity diffusion region 120 and the second impurity diffusion regions 124 of FIG. 1 are illustrated in FIGS. 2A and 2B, the inventive concept is not limited thereto and the planar structures of the first impurity diffusion region 120 and the second impurity diffusion regions 124 may be modified and changed so as to have various arrangement structures, such as a mesh shape arrangement structure, a checkerboard shape arrangement structure, a hexagonal arrangement structure, and a linear or curved arrangement structure.

In some embodiments for forming the plurality of second impurity diffusion regions 124 in the first impurity diffusion region 120 in order to manufacture the semiconductor device 100A illustrated in FIG. 1, a counter doping may be locally performed into the first impurity diffusion region 120. That is, after forming the first impurity diffusion region 120 in the substrate, impurities of a conductive type opposite to the conductive type of the first impurity diffusion region 120 may be implanted, with a doping concentration that is less than that of the first impurity diffusion region 120, in a partial region of the first impurity diffusion region 120, that is, in a region in which the plurality of second diffusion regions 124 will be formed. As a result, the impurities are diffused in the substrate, the first impurity diffusion region 120 may have a doping concentration less than a doping concentration thereof before the plurality of second impurity diffusion regions 124 are formed, and the plurality of second impurity diffusion regions 124 may have a doping concentration less than that of the first impurity diffusion region 120 while having the same conductive type as the first impurity diffusion region 120.

In some other embodiments for forming the plurality of second impurity diffusion regions 124 in the first impurity diffusion region 120 in order to manufacture the semiconductor device 100A illustrated in FIG. 1, impurities may be locally implanted only in a remaining region other than partial regions selected within the first impurity diffusion region 120. That is, impurities of a desired conductive type may be implanted only in a remaining region other than a region in which the plurality of second impurity diffusion regions 124 will be formed, within the first impurity diffusion region 120 formed in the substrate 102. Then, as impurity ions implanted in the substrate 102 are diffused, the first impurity diffusion region 120 may have a doping concentration less than a doping concentration thereof before the plurality of second impurity diffusion regions 124 are formed, and the plurality of second impurity diffusion regions 124 may have a doping concentration less than that of the first impurity diffusion region 120 while having the same conductive type as the first impurity diffusion region 120.

Figure 3:
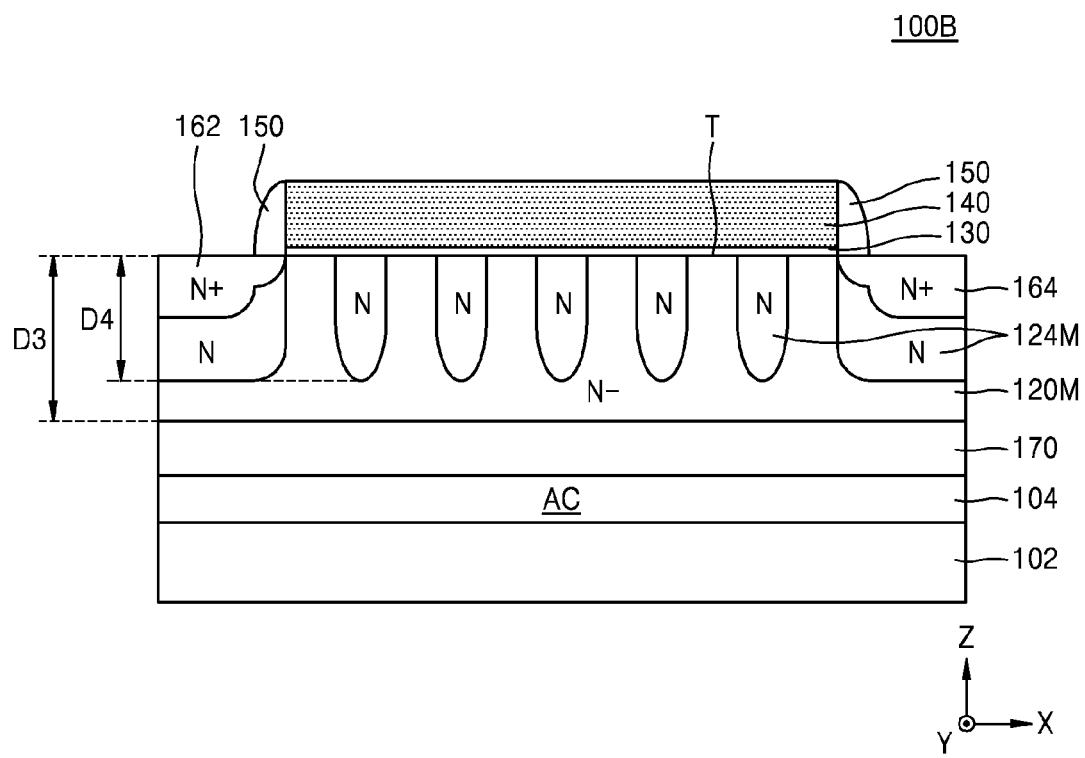
FIG. 3 is a cross-sectional view of a semiconductor device according to another exemplary embodiment of the inventive concept.

FIG. 3 is a cross-sectional view of a semiconductor device 100B according to another exemplary embodiment of the inventive concept. In FIG. 3, reference numerals that are the same as those of FIG. 1 denote the same elements, and thus, their detailed description will be omitted.

Referring to FIG. 3, a first impurity diffusion region 120M of a second conductive type is formed on a first conductive type well 104 in an active region AC of a semiconductor device 100B. In some embodiments, the first conductive type may be a P type, and the second conductive type may be an N type. The first impurity diffusion region 120M may include second conductive type impurities having a fourth doping concentration. The first impurity diffusion region 120M of the second conductive type may be an N type impurity diffusion region.

At least one second impurity diffusion region 124M, which is surrounded by the first impurity diffusion region 120M and has a fifth doping concentration that is different from the fourth doping concentration, is formed in the first impurity diffusion region 120M. The first impurity diffusion region 120M and that at least one second impurity diffusion region 124M may have the same conductive type. In some embodiments, the at least one second impurity diffusion region 124M may have an impurity doping concentration that is greater than that of the first impurity diffusion region 120M. For example, the first impurity diffusion region 120M may have an impurity concentration that is selected in the range of about $1\times10^{15}$ atoms/cm$^3$ to about $1\times10^{17}$ atoms/cm$^3$, and the at least one second impurity diffusion region 124M may have an impurity concentration that is selected in the range of about $1\times10^{16}$ atoms/cm$^3$ to about $1\times10^{21}$ atoms/cm$^3$ and is greater than that of the first impurity diffusion region 120M. However, these numerical values are only examples, and the inventive concept is not limited thereto.

In FIG. 3, the semiconductor device 100B may include a plurality of second impurity diffusion regions 124M. The plurality of second impurity diffusion regions 124M may be formed in the first impurity diffusion region 120M and may include a second impurity diffusion region 124M that is positioned under an electrode 140, a second impurity diffusion region 124M that is positioned under a source region 162, and a second impurity diffusion region 124M that is positioned under a drain region 164.

In the cross-sectional view of the semiconductor device 100B, illustrated in FIG. 3, the at least one second impurity diffusion region 124M includes a plurality of second impurity diffusion regions 124M spaced apart from each other. However, in a plane view (not shown) of the semiconductor device 100B, the plurality of second impurity diffusion regions 124M may be spaced apart from each other or at least some of the plurality of second impurity diffusion regions 124 may be connected to each other.

In some embodiments, each of the plurality of second impurity diffusion regions 124M may have an impurity doping concentration that is greater than that of the first impurity diffusion region 120M, and may have the same impurity concentration as each other. In some other embodiments, each of the plurality of second impurity diffusion regions 124M may have an impurity doping concentration that is greater than that of the first impurity diffusion region 120M, and at least some of the plurality of second impurity diffusion regions 124M may have different impurity concentrations.

The first impurity diffusion region 120M may have a shape surrounding the bottom surface and the sidewall of each of the plurality of second impurity diffusion regions 124M. A first depth D3 from the upper surface of the substrate 102 to the bottom surface of the first impurity diffusion region 120M is larger than a second depth D4 from the upper surface of the substrate 102 to the bottom surfaces of the plurality of the second impurity diffusion regions 124M.

The plurality of second impurity diffusion regions 124M may extend parallel to each other in the first impurity diffusion region 120M and in a thickness direction (Z direction in FIG. 3) of the substrate 102.

The first impurity diffusion regions 120M and the plurality of second impurity diffusion regions 124M are formed to face the electrode 140.

Among the plurality of second impurity diffusion region 124M, second impurity diffusion regions 124M positioned under the source region 162 and the drain region 164 may have a doping concentration that is less than that of the source region 162 and the drain region 164.

In the semiconductor device 100B illustrated in FIG. 3, the first impurity diffusion region 120M and the plurality of second impurity diffusion regions 124M, formed in the substrate 102, may form a lower electrode of a MOS capacitor. The electrode 140 may form an upper electrode of the MOS capacitor. Since the first impurity diffusion region 120M and each of the plurality of second impurity diffusion regions 124M have different impurity concentrations, a first capacitance may be obtained due to the first impurity diffusion region 120M, the electrode 140, and the insulating layer 130 interposed therebetween, and a second capacitance different from the first capacitance may be obtained due to the plurality of second impurity diffusion regions 124M, the electrode 124, and the insulating layer 130 interposed therebetween. In this manner, as the plurality of second impurity diffusion regions 124M each having a doping concentration that is less than that of the first impurity diffusion region 120M are included in the first impurity diffusion region 120M, a MOS capacitor in which a plurality of capacitors providing different capacitance values are connected to each other in parallel may be implemented in the semiconductor device 100B.

In some embodiments, as the impurity doping concentration of the plurality of second impurity diffusion regions 124M is less than that of the first impurity diffusion region 120M, the overall impurity doping concentration in a region including the first impurity diffusion region 120M and the plurality of second impurity diffusion regions 124M may be less than the impurity doping concentration of the first impurity diffusion region 120M. Accordingly, even though a well doping concentration in the substrate 102 increases due to a demand for devices having a relatively high well doping concentration according to the scaling of integrated circuit devices, a phenomenon, in which a range between a maximum capacitance (Cmax) and a minimum capacitance (Cmin), which determines a tuning range in a MOS variable capacitor, becomes narrow due to a high well doping concentration in the substrate 102 and thus tunability of the MOS variable capacitor is deteriorated, may be prevented.

Figure 4A:
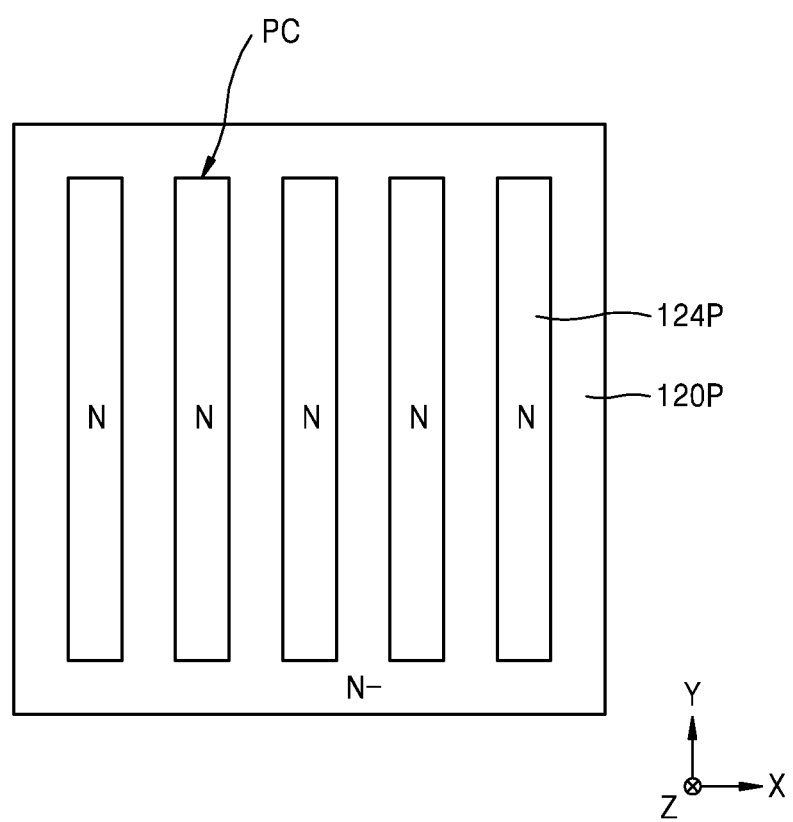
FIGS. 4A and 4B are plan views showing exemplary planar structures of a first impurity diffusion region and a plurality of second impurity diffusion regions of the semiconductor device illustrated in FIG. 3.
Figure 4B:
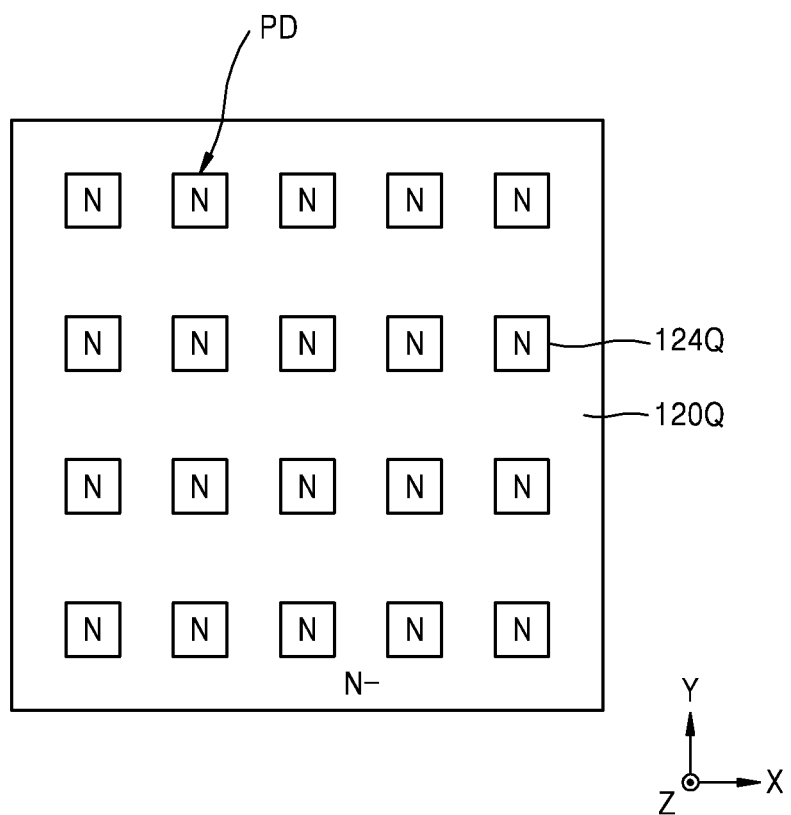

FIGS. 4A and 4B are plan views showing exemplary planar structures of the first impurity diffusion region 120M and the plurality of second impurity diffusion regions 124M of the semiconductor device 100B illustrated in FIG. 3.

In some embodiments, the first impurity diffusion region 120M of FIG. 3 may have a planar structure of a first impurity diffusion region 120P illustrated in FIG. 4A, and the plurality of second diffusion regions 124M of FIG. 3 may have a planar structure of a plurality of second impurity diffusion regions 124P illustrated in FIG. 4A.

The plurality of second impurity diffusion regions 124P may be formed of a plurality of pattern regions PC spaced apart from each other. The plurality of pattern regions PC may each have a rectangular plane shape having a long side in the Y direction and may extend parallel to each other in the first diffusion region 120P. The plurality of pattern regions PC may extend parallel to each other in a thickness direction (Z direction) of the substrate 120, like the plurality of second impurity diffusion region 124M illustrated in FIG. 3.

In FIG. 4A, although the plurality of second impurity diffusion region 124P are spaced apart from each other, at least some of the plurality of second impurity diffusion region 124P may be connected to each other.

In some other embodiments, the first impurity diffusion region 120M of FIG. 3 may have a planar structure of a first impurity diffusion region 120Q illustrated in FIG. 4B, and the plurality of second diffusion regions 124M of FIG. 3 may have a planar structure of a plurality of second impurity diffusion regions 124Q illustrated in FIG. 4B.

The plurality of second impurity diffusion regions 124Q may be formed of a plurality of pattern regions PD spaced apart from each other. The plurality of pattern regions PD may have shapes of a plurality of dots arranged in a matrix form in the X direction and the Y direction. The plurality of pattern regions PD may extend parallel to each other in a thickness direction (Z direction) of the substrate 120, like the plurality of second impurity diffusion region 124M illustrated in FIG. 3.

In FIG. 4B, although the plurality of second impurity diffusion region 124Q are spaced apart from each other, at least some of the plurality of second impurity diffusion region 124Q may be connected to each other.

Although planar structures of the first impurity diffusion region 120M and the second impurity diffusion regions 124M of FIG. 3 are illustrated in FIGS. 4A and 4B, the inventive concept is not limited thereto and the planar structures of the first impurity diffusion region 120M and the second impurity diffusion regions 124M may be modified and changed so as to have various arrangement structures, such as a mesh shape arrangement structure, a checkerboard shape arrangement structure, a hexagonal arrangement structure, and a linear or curved arrangement structure.

In order to manufacture the semiconductor device 100B illustrated in FIG. 3, the plurality of second impurity diffusion regions 124M may be formed before forming the first impurity diffusion region 120M. As impurities in the plurality of second impurity diffusion regions 124M are diffused in their surrounding areas by heat-treating a resultant structure having the plurality of second impurities formed therein, the first impurity diffusion region 120M having a doping concentration that is less than that of the plurality of second impurity diffusion regions 124M may be formed around the plurality of second impurity diffusion regions 124M.

Figure 5:
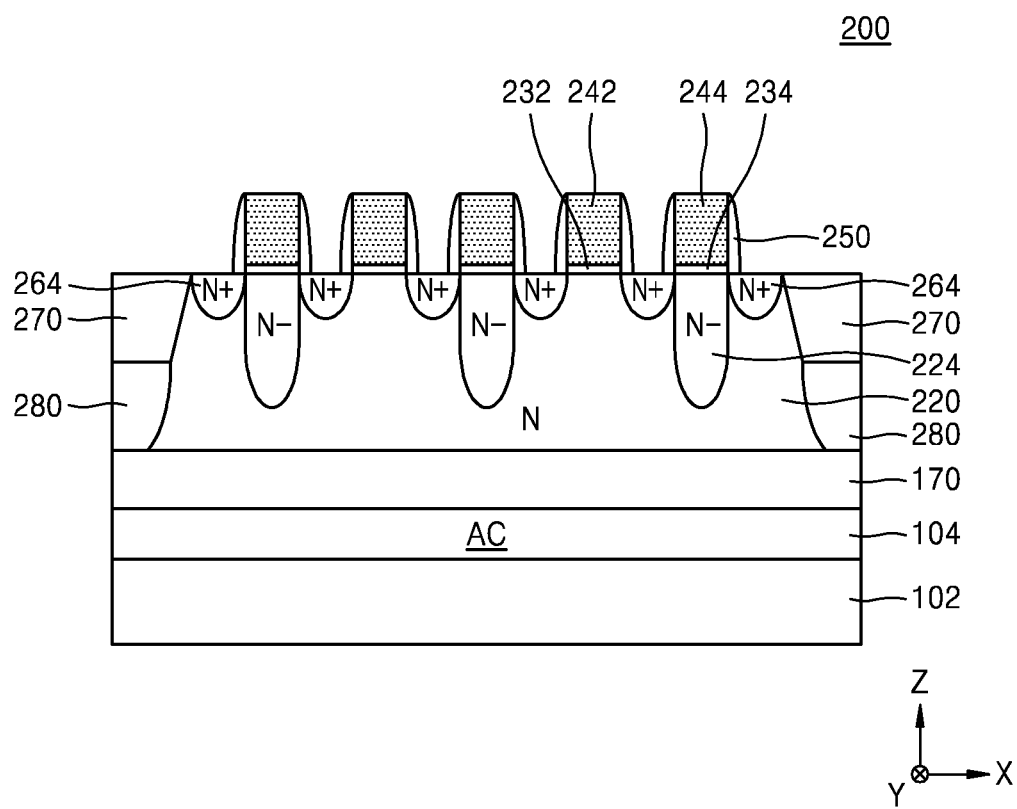
FIG. 5 is a cross-sectional view of a semiconductor device according to another exemplary embodiment of the inventive concept.

FIG. 5 is a cross-sectional view of a semiconductor device 200 according to another exemplary embodiment of the inventive concept. In FIG. 5, reference numerals that are the same as those of FIG. 1 denote the same elements, and thus, their detailed description will be omitted.

Referring to FIG. 5, the semiconductor device 200 includes a first impurity diffusion region 220 and a plurality of second impurity diffusion regions 224 that are surrounded by the first impurity diffusion region 220 and have a different impurity doping concentration than the first impurity diffusion region 220. More details of the first impurity diffusion region 220 and the plurality of second impurity diffusion regions 224 are substantially the same as those described with respect to the first impurity diffusion region 120 and the plurality of second impurity diffusion regions 124 with reference to FIG. 1.

The first impurity diffusion region 220 and the plurality of second impurity diffusion regions 224 may have various planar shapes as described with reference to FIGS. 2A and 2B.

The semiconductor device 200 includes a plurality of electrodes 242 and 244. The plurality of electrodes 242 and 244 include a first electrode 242 facing the first impurity diffusion region 220 and a second electrode 244 that is separated from the first electrode 242 and faces the plurality of second impurity regions 224.

A first insulating layer 232 is formed between the first impurity diffusion region 220 and the first electrode 242. A second insulating layer 234 is formed between the second impurity diffusion regions 224 and the second electrode 244. More details of the first insulating layer 232 and the second insulating layer 234 are substantially the same as those described with respect to the insulating layer 130 with reference to FIG. 1.

Both sides of the first insulating layer 232, both sides of the first electrode 242, both sides of the second insulating layer 234, and both sides of the second electrode 244 are covered with an insulating spacer 250. The insulating spacer 250 may have substantially the same structure as the insulating spacer 150 described with reference to FIG. 1.

At both sides of the first electrode 242 and both sides of the second electrode 244, source/drain regions 264 are formed in an active region AC of the substrate 102. The source/drain regions 264 may be second conductive type impurity diffusion regions each having a doping concentration that is greater than that of the first impurity diffusion region 220.

The size of the first impurity diffusion region 220 may be defined by a device isolation layer 270. The device isolation layer 270 may include an oxide film, a nitride film, or a combination thereof. A device isolation well 280 may be formed between the device isolation layer 270 and a deep well 170. In some embodiments, the device isolation well 280 may be an N type impurity diffusion region, but is not limited thereto.

In the semiconductor device 200 illustrated in FIG. 5, the first impurity diffusion region 220 and the plurality of second impurity diffusion regions 224, formed in the substrate 102, may form a lower electrode of a MOS capacitor. A plurality of first electrodes 242 and a plurality of second electrodes 244 each may form an upper electrode of the MOS capacitor. Since the first impurity diffusion region 220 and each of the plurality of second impurity diffusion regions 224 have different impurity concentrations, a first capacitance may be obtained due to the first impurity diffusion region 220, the first electrodes 242, and the first insulating layer 232 interposed therebetween, and a second capacitance different from the first capacitance may be obtained by the plurality of second impurity diffusion regions 224, the second electrodes 244, and the second insulating layer 234 interposed therebetween. In this manner, as the plurality of second impurity diffusion regions 224 are included in the first impurity diffusion region 220, a MOS capacitor in which a plurality of capacitors providing different capacitance values are connected to each other in parallel may be implemented in the semiconductor device 100A.

In some embodiments, as the impurity doping concentration of the plurality of second impurity diffusion regions 224 is less than that of the first impurity diffusion region 220, the overall impurity doping concentration in a region including the first impurity diffusion region 220 and the plurality of second impurity diffusion regions 224 may be less than the impurity doping concentration of the first impurity diffusion region 220. Accordingly, a phenomenon, in which a range between a maximum capacitance (Cmax) and a minimum capacitance (Cmin), which determines a tuning range in a MOS variable capacitor, becomes narrow due to a high substrate concentration and thus tunability of the MOS variable capacitor is deteriorated, may be prevented.

Figure 6:
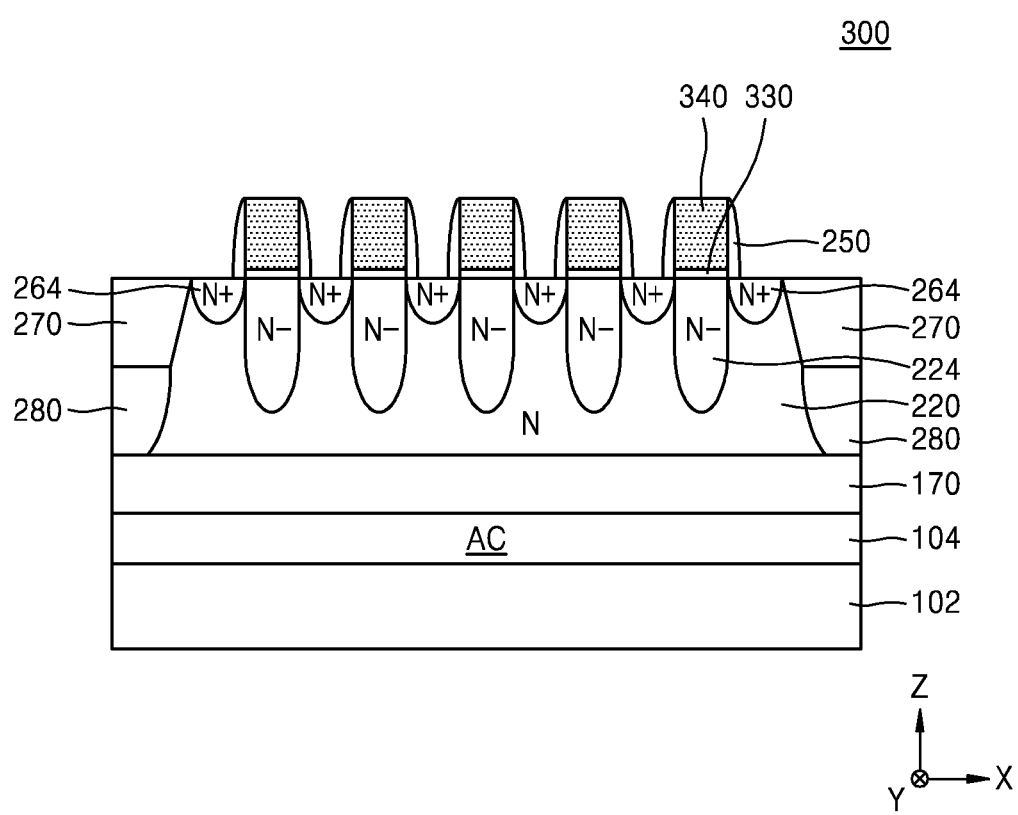
FIG. 6 is a cross-sectional view of a semiconductor device according to another exemplary embodiment of the inventive concept.

FIG. 6 is a cross-sectional view of a semiconductor device 300 according to another exemplary embodiment of the inventive concept. In FIG. 6, reference numerals that are the same as those of FIGS. 1 and 5 denote the same elements, and thus, their detailed description will be omitted.

Referring to FIG. 6, the semiconductor device 300 includes a first impurity diffusion region 220 and a plurality of second impurity diffusion regions 224 that are surrounded by the first impurity diffusion region 220 and have a different impurity doping concentration than the first impurity diffusion region 220.

The semiconductor device 300 includes a plurality of electrodes 340. The plurality of electrodes 340 are formed to face the plurality of second impurity diffusion regions 224. A plurality of insulating layers 330 are formed between the second impurity diffusion regions 224 and the electrodes 340. More details of the plurality of insulating layers 330 and the plurality of electrodes 340 of FIG. 6 are substantially the same as those described with respect to the insulating layer 130 and the electrode 140 with reference to FIG. 1.

Both sides of the plurality of insulating layers 330 and both sides of the plurality of electrodes are covered with an insulating spacer 250.

In the semiconductor device 300 illustrated in FIG. 6, the first impurity diffusion region 220 and the plurality of second impurity diffusion regions 224, formed in the substrate 102, may form a lower electrode of a MOS capacitor. Each of the plurality of electrodes 340 may form an upper electrode of the MOS capacitor. In the semiconductor device 300, a capacitor structure in which a plurality of MOS capacitors providing substantially the same capacitance are connected to each other in parallel may be implemented by the plurality of second impurity diffusion regions 224, the plurality of electrodes 340, and the plurality of insulating layers 330 interposed therebetween.

Figure 7A:
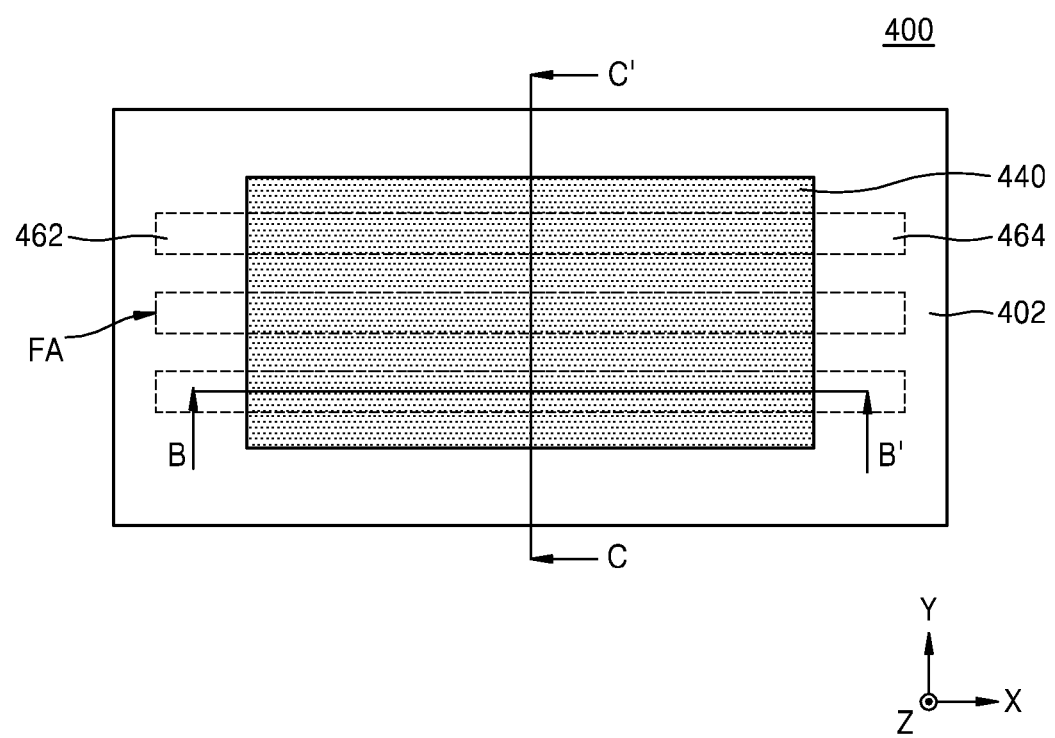
FIGS. 7A, 7B and 7C are diagrams for explaining a semiconductor device according to another exemplary embodiment of the inventive concept.
Figure 7B:
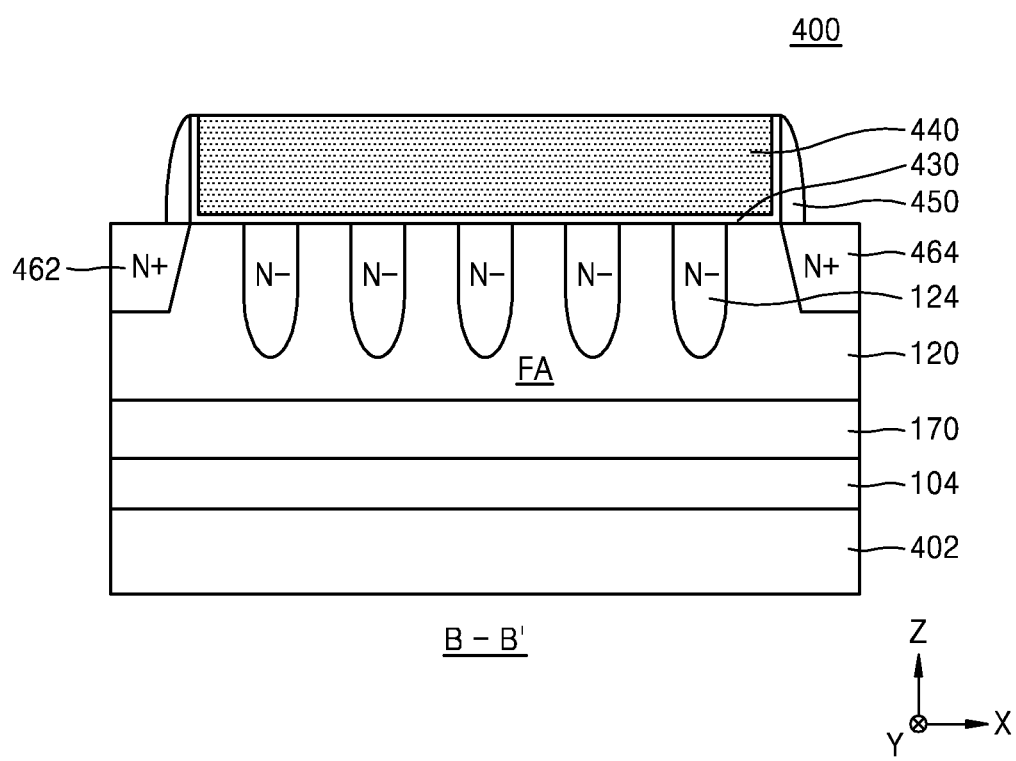
Figure 7C:
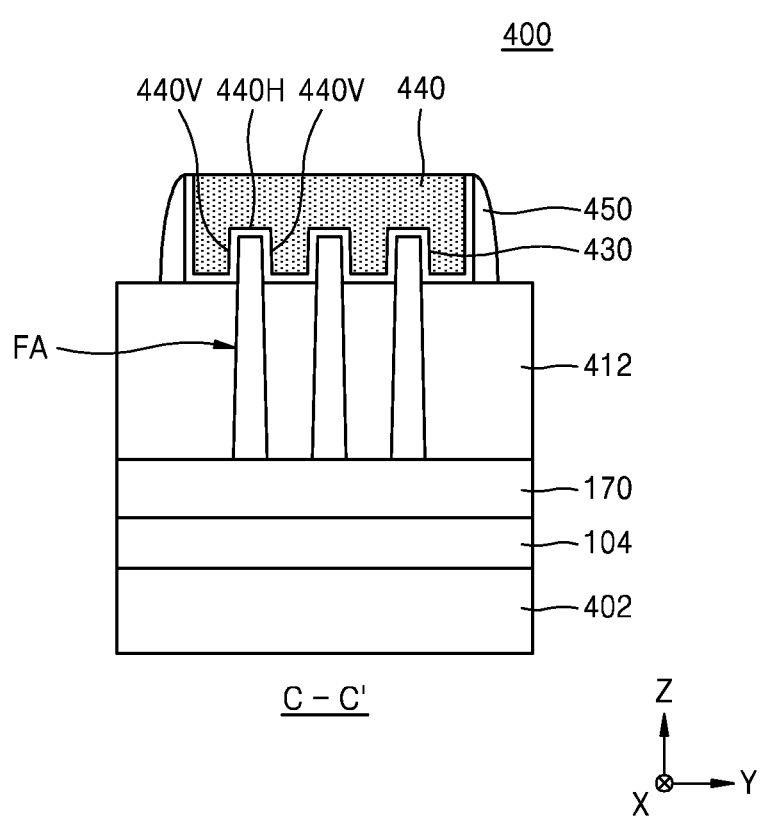

FIGS. 7A through 7C are diagrams for explaining a semiconductor device 400 according to another exemplary embodiment of the inventive concept. FIG. 7A is a plan view of the semiconductor device 400 including a fin field effect transistor (FinFET) device, FIG. 7B is a cross-sectional view taken along a line B-B' of FIG. 7A, and FIG. 7C is a cross-sectional view taken along a line C-C' of FIG. 7A.

In FIGS. 7A through 7C, reference numerals that are the same as those of FIG. 1 denote the same elements, and thus, their detailed description will be omitted.

Referring to FIGS. 7A through 7C, a substrate 402 includes a plurality of fin-type active regions FA protruding upward in the Z direction.

The substrate 402 may include a semiconductor, such as Si or Ge, or a compound semiconductor, such as SiGe, SiC, GaAs, InAs, or InP. Also, the substrate 102 may have a silicon on insulator (SOI) structure.

The plurality of fin-type active regions FA extend parallel to each other on the substrate 402 and in the X direction.

A device isolation layer 412 is formed between the plurality of fin-type active regions FA. Each of the plurality of fin-type active regions FA protrudes on the device isolation layer 412.

An electrode 440 is formed on the plurality of fin-type active regions FA and the device isolation layer 412. The electrode 440 may extend in a direction intersecting the plurality of fin-type active regions FA. In FIGS. 7A through 7C, although the plurality of fin-type active regions FA are covered with one electrode 440, the inventive concept is not limited thereto. For example, a plurality of electrodes may be formed on the plurality of fin-type active regions FA. In this case, the plurality of electrodes may be formed to extend on the plurality of fin-type active regions FA and in a direction (X direction) intersecting the plurality of fin-type active regions FA. The plurality of electrodes may extend parallel to each other in the Y direction.

A first impurity diffusion region 120 and a plurality of second impurity diffusion regions 124 are formed in each of the plurality of fin-type active regions FA. As shown in FIG. 7C, the electrode 440 has a pair of vertical surfaces 440V facing both sides of each of the plurality of fin-type active regions FA and a horizontal surface 440H facing the upper surface of each of the plurality of fin-type active regions FA.

An insulating layer 430 is formed between the plurality of fin-type active regions FA and the electrode 440. In the semiconductor device 400, a plurality of MOS capacitors connected to each other in parallel while having a three dimensional structure may be formed between the plurality of active regions FA and the electrode 440 facing thereto.

The materials of the insulating layer 430 and the electrode 440 may be the same as those of the insulating layer 130 and the electrode 140 illustrated in FIG. 1.

In some embodiments, the plurality of fin-type active regions FA may be formed in the substrate 402 to manufacture the semiconductor device 400. After forming the device isolation layer 412, which makes a portion of each of the plurality of fin-type active regions FA protrude on the device isolation layer 412, on the substrate 402, an ion implantation process may be performed on the plurality of fin-type active regions FA in the same method as that described with reference to FIG. 1 to form the first impurity diffusion region 120 and the plurality of second impurity diffusion regions 124.

Next, processes of forming the insulating layer 430 and the electrode 440 which cover exposed both sidewalls and upper surface of each of the plurality of fin-type active regions FA may be performed according to a gate last process or a replacement metal gate (RMG) process. A process of forming the insulating spacer 450 covering sidewalls of the electrode 440 may be performed before processes of forming the insulating layer 430 and the electrode 440. Although the electrode 440 obtained as a result of the gate last process and the insulating layer 430 formed to cover a bottom surface and sidewalls of the electrode 440 are illustrated in FIGS. 7A through 7C, the inventive concept is not limited thereto. For example, the electrode 440 may be formed according to a gate first process. In this case, the insulating layer 430 that is formed between the electrode 440 and the substrate 402 may be formed to cover only the bottom surface of the electrode 440.

After or before the electrode 440 is formed, a source region 462 and a drain region 464 may be formed in each of the plurality of fin-type active regions FA at both sides of the electrode 440. In order to form the source region 462 and the drain region 464, recess regions may be formed by etching partial regions of the plurality of fin-type active regions FA and semiconductor layers may be formed in the recess regions by using an epitaxial growth process. During forming the semiconductor layers, the semiconductor layers may be doped with impurities through in-situ doping. The source region 462 and the drain region 464 each may have a raised source/drain (RSD) structure having an upper surface whose level is greater than those of the upper surfaces of the fin-type active regions FA.

In FinFET devices forming the semiconductor device 400 illustrated in FIGS. 7A through 7C, a PMOS capacitor or an NMOS capacitor may be formed according to the type of impurities that are implanted in the source region 462 and the drain region 464.

Figure 8A:
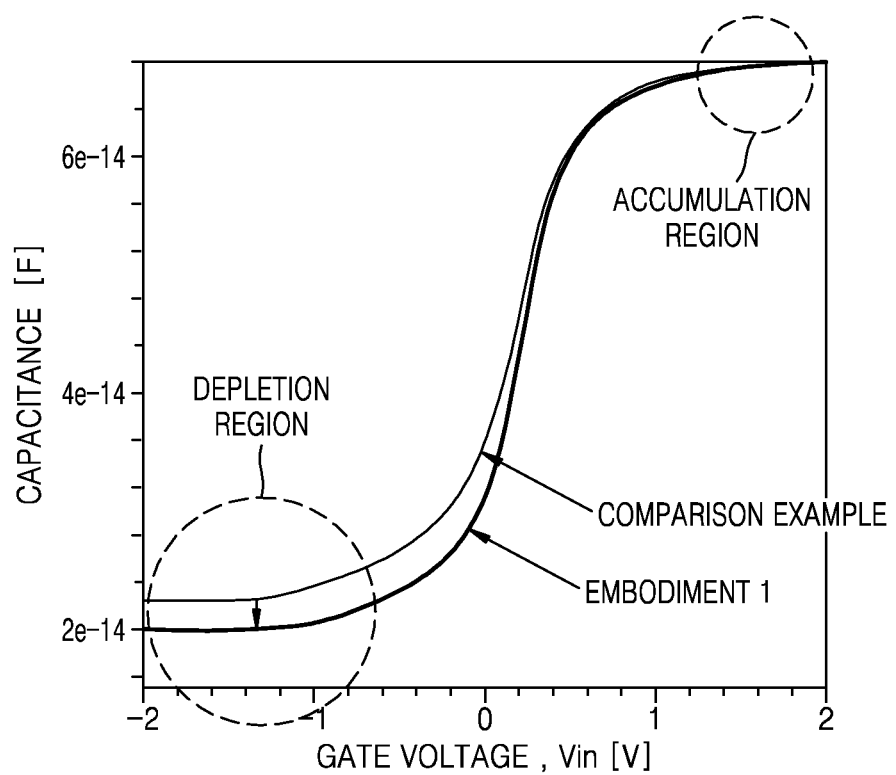
FIGS. 8A and 8B are capacitance-voltage (C-V) curve graphs each illustrating capacitance characteristics to a gate voltage, with respect to semiconductor devices according to exemplary embodiments and a comparison example.
Figure 8B:
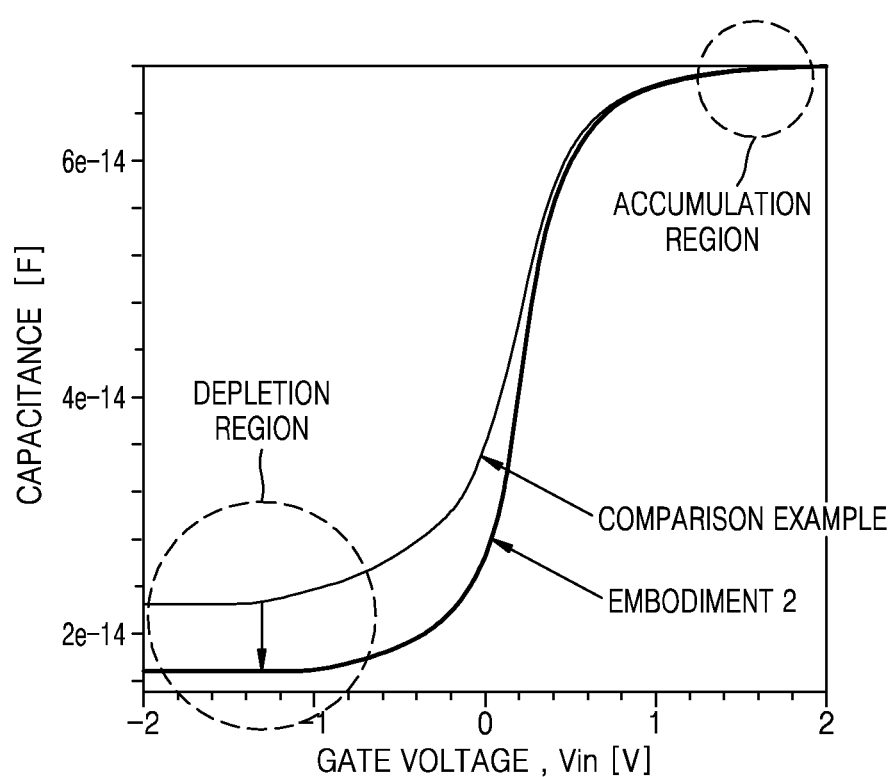

FIGS. 8A and 8B are capacitance-voltage (C-V) curve graphs each illustrating capacitance characteristics to a gate voltage, with respect to semiconductor devices according to exemplary embodiments and a comparison example.

More specifically, "EMBODIMENT 1" illustrated in FIG. 8A indicates an evaluation result for a semiconductor device that has a structure corresponding to the semiconductor device 100A of FIG. 1 and includes an N type first impurity diffusion region 120 obtained by a counter doping, that is, a method of locally implanting P type impurity ions in the N type first impurity diffusion region 120, and a plurality of second impurity diffusion regions 124 which have the same conductive type as the first impurity diffusion region 120 and have a doping concentration that is less than that of the first impurity diffusion region 120

"EMBODIMENT 2" illustrated in FIG. 8B indicates an evaluation result for a semiconductor device that has a structure corresponding to the semiconductor device 100A of FIG. 1 and includes an N type first impurity diffusion region 120, obtained by locally implanting impurity ions only in a first region corresponding to a portion of the range of the first impurity diffusion region 120, and a plurality of second impurity diffusion regions 124 which are second regions corresponding to remaining regions (that is, regions in which impurities are not implemented) other than the first region in the range of the first diffusion region 120 and include dopants diffused from the first region. The plurality of second impurity diffusion regions 124 have the same conductive type as the first impurity diffusion region 120 and have a doping concentration that is less than that of the first impurity diffusion region 120.

"COMPARISON EXAMPLE" illustrated in FIGS. 8A and 8B indicates an evaluation result for a semiconductor device having the same structure as those of the semiconductor devices according to "EMBODIMENT 1" and "EMBODIMENT 2", except that the semiconductor device according to "COMPARISON EXAMPLE" does not include the plurality of second impurity diffusion regions 124.

In the case of "EMBODIMENT 1" and "EMBODIMENT 2", since the plurality of second impurity diffusion regions 124 formed to have a doping concentration less than that of the first impurity diffusion region 120 while having the same conductive type as the first impurity diffusion region 120 by using a counter doping process or a local doping process are included in the first impurity diffusion region 120, the doping concentration in the first impurity diffusion region 120 is lowered overall. Thus, as shown in FIGS. 8A and 8B, a minimum capacitance Cmin in a depletion operation of a MOS capacitor is lowered, compared to the case of "COMPARISON EXAMPLE". Accordingly, in the case of the semiconductor devices according to "EMBODIMENT 1" and "EMBODIMENT 2", a range between a maximum capacitance (Cmax) and a minimum capacitance (Cmin), which determines a tuning range in a MOS variable capacitor, increases compared to the case of "COMPARISON EXAMPLE" and thus tunability of the MOS variable capacitor may be improved.

Figure 9:
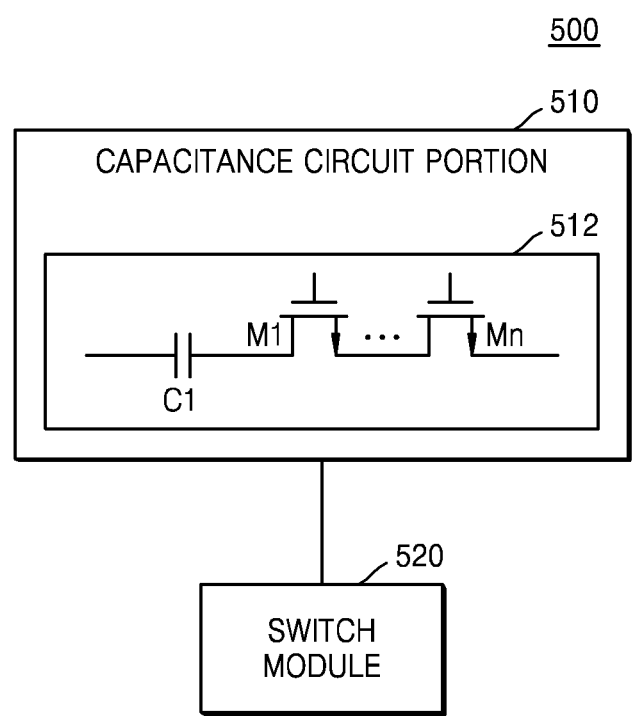
FIG. 9 is a schematic configuration diagram of a variable capacitance circuit including a semiconductor device according to an exemplary embodiment of the inventive concept.

FIG. 9 is a schematic configuration diagram of a variable capacitance circuit 500 including a semiconductor device according to an exemplary embodiment of the inventive concept.

Referring to FIG. 9, the variable capacitance circuit may include a capacitance circuit portion 510 and a switch module 520. The capacitance circuit portion 510 includes a switched capacitor unit 512. The switched capacitor unit 512 may include a switch portion including at least one switching device M1 through Mn to switch a path for forming capacitance and a capacitor portion for providing capacitance C1 to a path formed according to the switching of the switch portion. The switch portion and the capacitor portion may be connected to each other in series. The capacitor portion may include a semiconductor device having at least one selected from the group consisting of structures of the semiconductor devices 100A, 100B, 200, 300, and 400 described with reference to FIGS. 1 through 7C and structures modified and changed therefrom.

Figure 10:
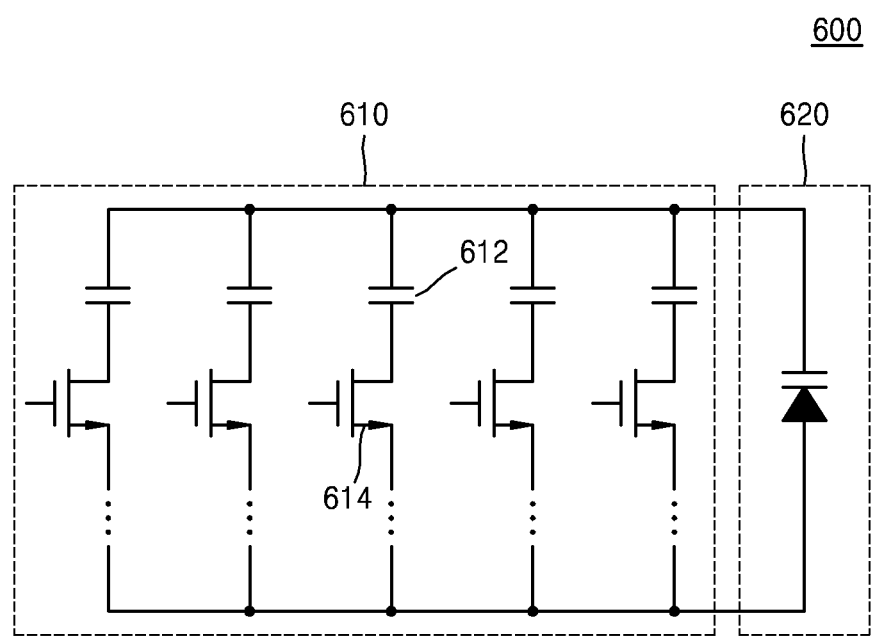
FIG. 10 is a schematic circuit diagram of a hybrid variable capacitor including a semiconductor device according to an exemplary embodiment of the inventive concept.

FIG. 10 is a schematic circuit diagram of a hybrid variable capacitor 600 including a semiconductor device according to an exemplary embodiment of the inventive concept.

Referring to FIG. 10, the hybrid variable capacitor 600 may include a capacitor array 610 and a MOS varactor 620.

The capacitor array 610 may have variable capacitance. The capacitor array 610 includes a capacitor 612 and at least one FET switch 614 connected to the capacitor 612. The at least one FET switch 614 may perform a switching operation according to the value of a lower bit area of a digital value corresponding to capacitance to be adjusted. The capacitor array 610 may have variable capacitance according to the switching of the at least one FET switch 614.

The MOS varactor 620 may perform a coarse tuning, and the capacitor array 610 may perform a fine tuning. The MOS varactor 620 may vary a capacitance value through a layer whose dielectric constant is changed according to a voltage applied thereto.

At least one selected from the capacitor array 610 and the MOS varactor 620 may include a semiconductor device having at least one selected from the group consisting of structures of the semiconductor devices 100A, 100B, 200, 300, and 400 described with reference to FIGS. 1 through 7C and structures modified and changed therefrom.

Figure 11:
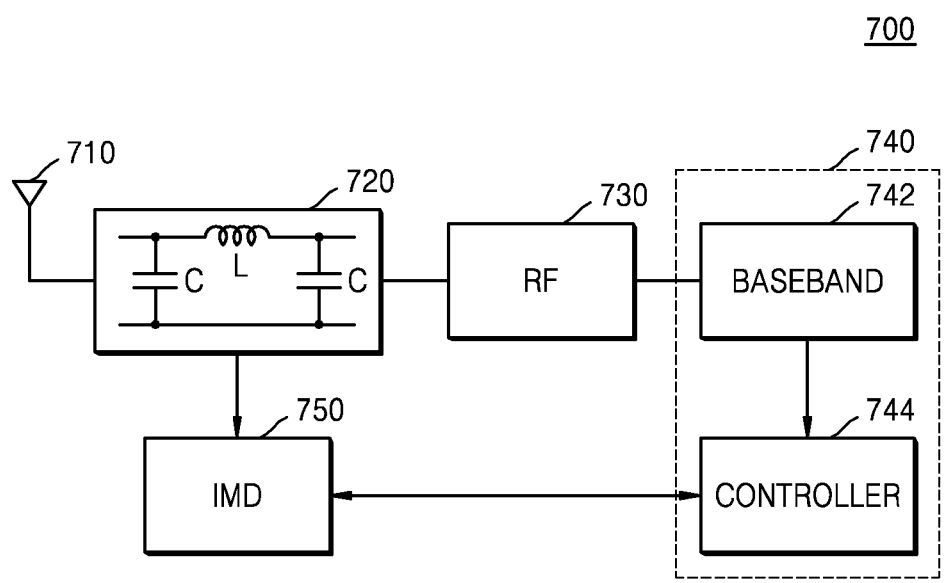
FIG. 11 is a schematic block diagram of a radio frequency (RF) apparatus including a semiconductor device according to an exemplary embodiment of the inventive concept.

FIG. 11 is a schematic block diagram of a radio frequency (RF) apparatus 700 including a semiconductor device according to an exemplary embodiment of the inventive concept.

Referring to FIG. 11, the RF apparatus 700 may include an antenna 710, an adjustable matching network 720, an RF module 730, a signal processing module 740, and an impedance detector 750. In some embodiments, the impedance detector 750 may be omitted.

The antenna 710 may transmit an RF signal to the outside or may receive an RF signal from the outside.

The RF module 730 may transmit a high frequency signal to the antenna 710 or may receive a high frequency signal from the antenna 710. When the antenna 710 is for transmitting an RF signal, the RF module 730 may be an RF transmitter module. When the antenna 710 is for receiving an RF signal, the RF module 730 may be an RF receiver module. When the antenna 710 is for transmitting and receiving an RF signal, the RF module 730 may be an RF transceiver module.

The matching network 720 is installed between the antenna 710 and the RF module 730. The matching network 720 includes a variable capacitor component C and an inductor component L. In this case, an impedance matching may be performed by adjusting the variable capacitor component C. In the matching network 720, the capacitance of the variable capacitor component C is adjusted according to the control of the signal processing module 740 so that the matching of a front end of the RF module 730 may be performed. The variable capacitor component C may include the hybrid variable capacitor 600 illustrated in FIG. 10. The matching network 720 may include a semiconductor device having at least one selected from the group consisting of structures of the semiconductor devices 100A, 100B, 200, 300, and 400 described with reference to FIGS. 1 through 7C and structures modified and changed therefrom.

The signal processing module 740 is connected to a back end of the RF module 730 and processes a high frequency signal received from the RF module 730 or a signal to be transmitted to the RF module 730. Also, the signal processing module 740 may control the capacitance of a hybrid variable capacitor so that a matching is performed in the matching network 720.

The signal processing module 740 may include a baseband signal processor 742 and a controller 744. The baseband signal processor 742 processes a high frequency signal received from the RF module 730 or a signal to be transmitted to the RF module 730. The controller 744 may control the capacitance of the hybrid variable capacitor so that a matching is performed in the matching network 720.

The impedance detector 750 detects the impedance of the matching network 720. A signal detected by the impedance detector 750 may be transmitted to the controller 744 of the signal processing module 740. The controller 744 may determine whether an impedance mismatch occurs, based on the detected signal. When it is determined that an impedance mismatch occurs, the controller 744 may adjust capacitance to provide a matching of the matching network 720.

Figure 12:
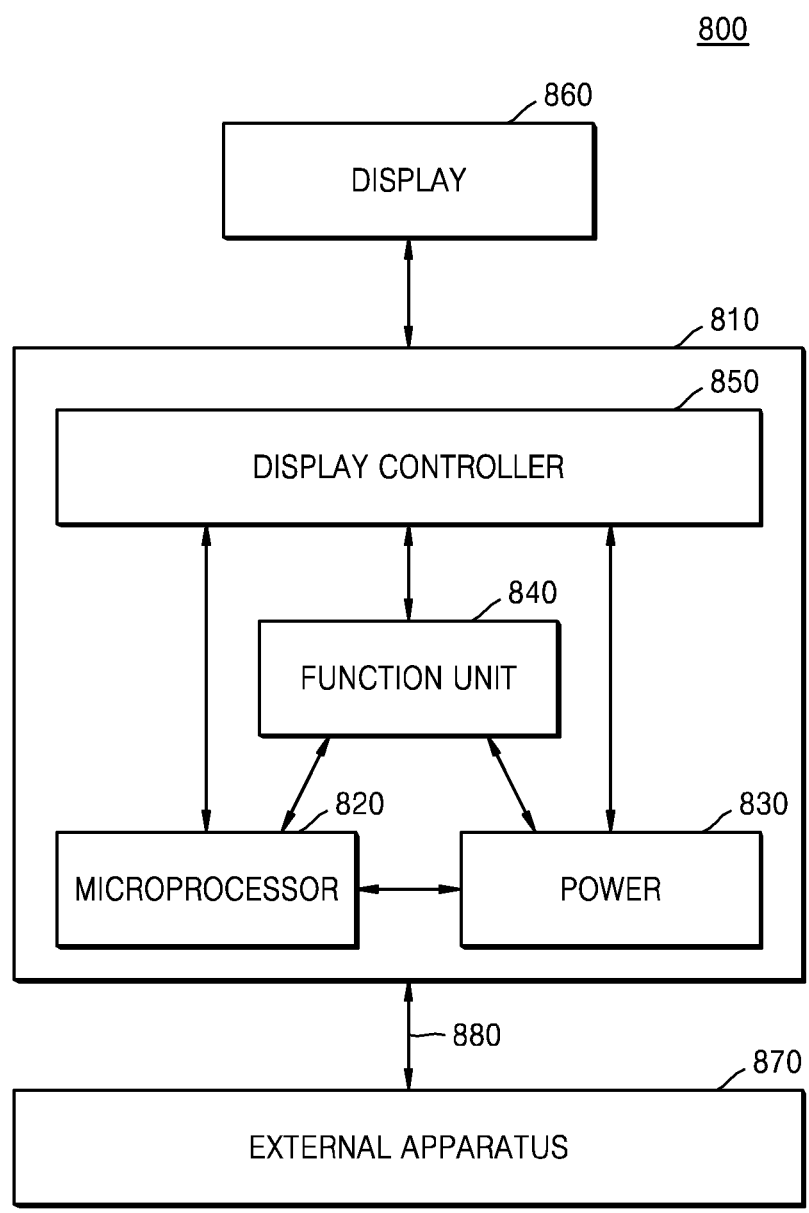
FIG. 12 is a block diagram of an electronic system including a semiconductor device according to an exemplary embodiment of the inventive concept.

FIG. 12 is a block diagram of an electronic system 800 including a semiconductor device according to an exemplary embodiment of the inventive concept.

Referring to FIG. 12, the electronic system 800 may include a body 810, a microprocessor 820, a power 830, a functional unit 840, and a display controller 850.

The body 810 may be a mother board formed of a printed circuit board (PCB). The microprocessor 820, the power 830, the functional unit 840, and the display controller 850 may be mounted on the body 810. A display 860 may be disposed inside or outside the body 810. For example, the display 860 may be disposed on the surface of the body 810 and display an image processed by the display controller 850.

The power 830 may receive a certain voltage from an external battery, divide the received voltage into voltages having required levels, and selectively supply the voltages having the required levels to the microprocessor 820, the functional unit 840, and the display controller 850. The microprocessor 820 may receive a voltage from the power 830 and control the functional unit 840 and the display 860. The functional unit 840 may perform various functions of the electronic system 800. For example, when the electronic system 800 is a mobile phone, the functional unit 840 may include various components that may perform mobile phone functions, such as dialing, outputting an image to the display 860 through communication with an external apparatus 870, and outputting a sound to a speaker (not shown) through communication with an external apparatus 870. In addition, when a camera is installed in the electronic system 800, the functional unit 840 may perform a function of a camera image processor.

When the electronic system 800 is connected to a memory card to expand memory capacity, the functional unit 840 may be a memory card controller. The function unit 840 may receive or transmit a signal to or from the external apparatus 870 through a wired or wireless communication unit 880. When the electronic system 800 needs a universal serial bus (USB) to extend functions, the functional unit 840 may function as an interface controller. The functional unit 840 may include a high capacity storage apparatus.

At least one of the microprocessor 820, the power 830, the functional unit 840, and the display controller 850 may include a semiconductor device having at least one selected from the group consisting of structures of the semiconductor devices 100A, 100B, 200, 300, and 400 described with reference to FIGS. 1 through 7C and structures modified and changed therefrom.

Figure 13:
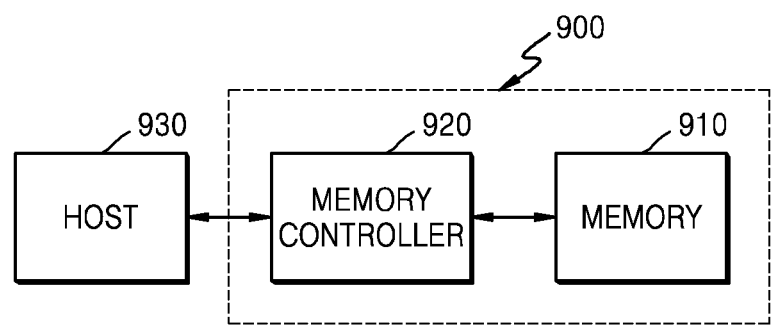
FIG. 13 is a block diagram of an electronic system according to an exemplary embodiment of the inventive concept.

FIG. 13 is a block diagram of an electronic system 900 according to an exemplary embodiment of the inventive concept.

The electronic system 900 includes a memory 910 and a memory controller 920. The memory controller 920 controls the memory 910 to read data from the memory 910 and/or write data to the memory 910 in response to a request of a host 930. At least one selected from the memory 910 and the memory controller 920 may include a semiconductor device having at least one selected from the group consisting of structures of the semiconductor devices 100A, 100B, 200, 300, and 400 described with reference to FIGS. 1 through 7C and structures modified and changed therefrom.

Figure 14:
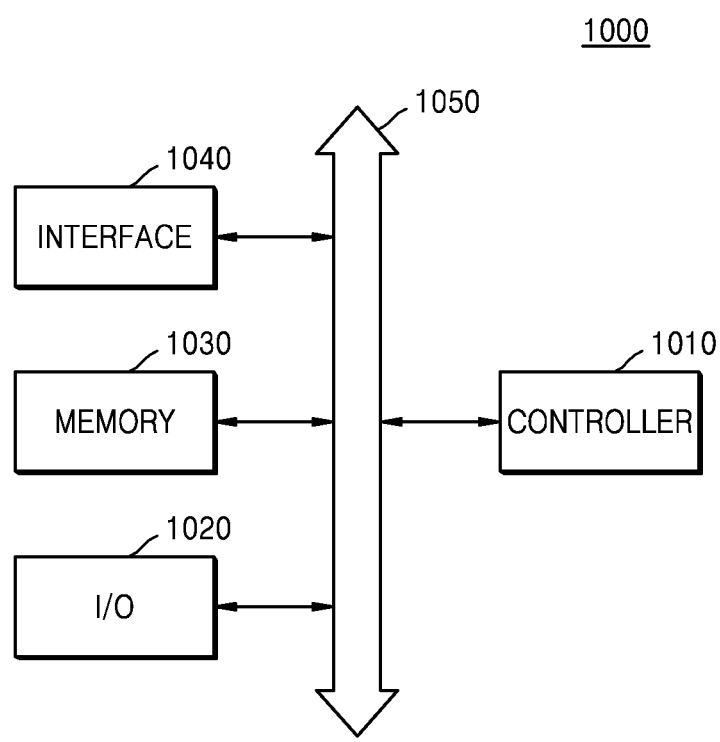
FIG. 14 is a block diagram of an electronic system according to another exemplary embodiment of the inventive concept.

FIG. 14 is a block diagram of an electronic system 1000 according to another exemplary embodiment of the inventive concept.

The electronic system 1000 includes a controller 1010, an input/output (I/O) device 1020, a memory 1030, and an interface 1040, which are connected to one another via a bus 1050.

The controller 1010 may include at least one selected from a microprocessor, a digital signal processor, and a processing device that is similar thereto. The I/O device 1020 may include at least one selected from a keypad, a keyboard, and a display. The memory 1030 may be used for storing a command that is executed by the controller 1010. For example, the memory 1030 may be used for storing user data.

The electronic system 1000 may be configured as an apparatus that may transmit and/or receive information under a wireless communication apparatus or a wireless environment. In the electronic system 1000, the interface 1040 may be configured as a wireless interface to transmit and/or receive data through a wireless communication network. The interface 1040 may include an antenna and/or a wireless transceiver. In some exemplary embodiments, the electronic system 1000 may be used for a communication interface protocol of a third generation communication system, such as a code division multiple access (CDMA) system, a global system for mobile communications (GSM), a north American digital cellular (NADC) system, an extended-time division multiple access (E-TDMA) system, or a wide band code division multiple access (WCDMA) system. The electronic system 1000 may include a semiconductor device having at least one selected from the group consisting of structures of the semiconductor devices 100A, 100B, 200, 300, and 400 described with reference to FIGS. 1 through 7C and structures modified and changed therefrom.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
a lower electrode comprising first and second impurity diffusion regions in an active region of a substrate, the first and second impurity diffusion regions having different doping concentrations;
an upper electrode facing both the first and second impurity diffusion regions of the lower electrode; and
an insulating layer interposed between the first and second impurity diffusion regions of the lower electrode and the upper electrode, and
wherein the lower electrode, the upper electrode and the insulating layer constitute a single MOS capacitor, and
the second impurity diffusion region has a bottom and sides, and the first impurity diffusion region surrounds the second impurity diffusion region along the bounds of the sides of the second impurity diffusion region such that the first impurity region extends around the second impurity diffusion region.

2. The semiconductor device of claim 1, wherein the first impurity diffusion region also surrounds the second impurity diffusion region along bounds of the bottom of the second impurity diffusion region such that the first impurity region also extends beneath the second impurity diffusion region.

3. The semiconductor device of claim 1, wherein the second impurity diffusion region has a plurality of sections spaced laterally apart from each other in the first impurity diffusion region,
the sections being surrounded by the first impurity diffusion region along the bounds of said sides thereof such that the first impurity diffusion region extends around each of the sections of the second impurity diffusion region.

4. The semiconductor device of claim 3, wherein the sections of the second impurity diffusion region extend parallel to each other in a thickness direction of the substrate.

5. The semiconductor device of claim 1, wherein the first impurity diffusion region and the second impurity diffusion region are of a same conductive type.

6. The semiconductor device of claim 1,
wherein the active region comprises semiconductor material such that each of the first and second impurity diffusion regions of the lower electrode comprises semiconductor material doped with impurities, and
the insulating layer extends in a first horizontal direction between the first and second impurity diffusion regions as interposed between the lower electrode and the upper electrode,
whereby a doping concentration of the lower electrode varies in said first horizontal direction in which the insulating layer extends between the first and second impurity diffusion regions.

7. The semiconductor device of claim 6, wherein the first impurity diffusion region and the second impurity diffusion region are of a same conductive type.

8. The semiconductor device of claim 7, wherein the doping concentration of the second impurity diffusion region is less than that of the first impurity diffusion region.

9. The semiconductor device of claim 7, wherein the second impurity diffusion region has a plurality of sections spaced laterally apart from each other in said first horizontal direction, and
the sections of the second impurity diffusion region extend in parallel to each other in a thickness direction of the substrate.

10. The semiconductor device of claim 6, wherein the upper electrode comprises at least one of a doped semiconductor, a metal, a conductive metal nitride, and a metal silicide.

11. The semiconductor device of claim 6, wherein the doping concentration of the first impurity diffusion region of the lower electrode is in a range of $1 \times 10^{16}$ atoms/cm$^3$ to $1 \times 10^{21}$ atoms/cm$^3$, and the doping concentration of the second impurity diffusion region of the lower electrode is in a range of $1\times10^{15}$ atoms/cm$^3$ to $1\times10^{17}$ atoms/cm$^3$.

12. The semiconductor device of claim 1, wherein the first impurity diffusion region also surrounds the sections of the second impurity diffusion region along the bounds of the bottoms of said sections such that the first impurity region also extends beneath the second impurity diffusion region.

13. A semiconductor device comprising:
- an active region comprising at least one fin protruding upwardly from an upwardly facing surface of a substrate,
- each said at least one fin having a first impurity diffusion region and a second impurity diffusion region within the first impurity region, the first impurity region having a doping concentration different from that of the second impurity region, and the first impurity region surrounding the second impurity region in the fin;
- an electrode facing the first impurity diffusion region and the second impurity diffusion region, the electrode having a pair of surfaces facing opposite side surfaces of the fin, respectively, and a horizontal surface facing an upper surface of the fin; and
- an insulating layer interposed between said surfaces of the electrode and both the first and second impurity diffusion regions of the fin.

14. The semiconductor device of claim 13, wherein the at least one fin comprises a plurality of fins protruding upwardly from the upwardly facing surface of the substrate, the fins extend parallel to each other, and the electrode extends across the fins.

15. The semiconductor device of claim 13, wherein the second impurity diffusion region has a plurality of sections spaced apart from each other along the length of the fin within the first impurity diffusion region, and the electrode faces the first impurity diffusion region and said sections of the second impurity diffusion region.

* * * * *